(12) United States Patent
Bhatia et al.

(10) Patent No.: US 9,586,816 B2
(45) Date of Patent: Mar. 7, 2017

(54) NANOSTRUCTURE-BASED TRANSPARENT CONDUCTORS HAVING INCREASED HAZE AND DEVICES COMPRISING THE SAME

(75) Inventors: Rimple Bhatia, Los Altos, CA (US); Hash Pakbaz, Hayward, CA (US); Jelena Sepa, Mountain View, CA (US); Teresa Ramos, San Jose, CA (US); Florian Pschenitzka, San Francisco, CA (US); Michael A. Spaid, Mountain View, CA (US); Karl Pichler, Admont (AT)

(73) Assignee: CAM Holding Corporation, Tortola (VG)

( * ) Notice: Subject to any disclaimer, the term of this patent is extended or adjusted under 35 U.S.C. 154(b) by 71 days.

(21) Appl. No.: 12/960,316

(22) Filed: Dec. 3, 2010

(65) Prior Publication Data

US 2011/0163403 A1 Jul. 7, 2011

Related U.S. Application Data

(60) Provisional application No. 61/266,945, filed on Dec. 4, 2009.

(51) Int. Cl.
*H01L 31/0224* (2006.01)
*B82Y 20/00* (2011.01)
*H01L 31/0236* (2006.01)
*H01L 31/18* (2006.01)

(52) U.S. Cl.
CPC .......... *B82Y 20/00* (2013.01); *H01L 31/0236* (2013.01); *H01L 31/022466* (2013.01); *H01L 31/1884* (2013.01); *Y02E 10/50* (2013.01)

(58) Field of Classification Search
None
See application file for complete search history.

(56) References Cited

U.S. PATENT DOCUMENTS

| | | | |
|---|---|---|---|
| 7,849,424 B2 | 12/2010 | Wolk et al. | 716/3 |
| 8,310,009 B2 * | 11/2012 | Saran et al. | 257/347 |
| 2005/0121070 A1 | 6/2005 | Fujisawa et al. | |
| 2005/0214967 A1 * | 9/2005 | Scher et al. | 438/63 |
| 2007/0074316 A1 | 3/2007 | Alden et al. | 977/762 |
| 2007/0264844 A1 * | 11/2007 | Hu | G02F 1/133502 438/778 |
| 2007/0274895 A1 * | 11/2007 | Jesih et al. | 423/462 |
| 2008/0143906 A1 | 6/2008 | Allemand et al. | 349/43 |
| 2008/0210052 A1 | 9/2008 | Allemand | 75/300 |
| 2008/0259262 A1 | 10/2008 | Jones et al. | 349/139 |

(Continued)

FOREIGN PATENT DOCUMENTS

| CN | 1781034 A | 5/2006 |
|---|---|---|
| CN | 1786747 A | 6/2006 |

(Continued)

OTHER PUBLICATIONS

Sun et al., "Crystalline Silver Nanowires by Soft Solution Processing," *Nano Letters* 2(2):165-168, 2002.

*Primary Examiner* — Abul Kalam
(74) *Attorney, Agent, or Firm* — Cooper Legal Group, LLC (57) ABSTRACT

The present disclosure relates to modifications to nanostructure based transparent conductors to achieve increased haze/light-scattering with different and tunable degrees of scattering, different materials, and different microstructures and nanostructures.

6 Claims, 4 Drawing Sheets

(56) References Cited

U.S. PATENT DOCUMENTS

| | | |
|---|---|---|
| 2008/0314442 A1 | 12/2008 | Le Bellac et al. |
| 2009/0025793 A1* | 1/2009 | Kim .................... H01G 9/2031 136/262 |
| 2009/0052029 A1 | 2/2009 | Dai et al. ........................ 359/486 |
| 2009/0129004 A1* | 5/2009 | Gruner .................... 361/679.21 |
| 2009/0223703 A1 | 9/2009 | Winoto ........................ 174/257 |
| 2009/0228131 A1* | 9/2009 | Wolk et al. .................... 700/103 |
| 2009/0283304 A1 | 11/2009 | Winoto ........................ 174/257 |
| 2009/0321113 A1 | 12/2009 | Allemand et al. ............ 174/257 |
| 2010/0197068 A1* | 8/2010 | Poon et al. ...................... 438/63 |
| 2010/0243295 A1 | 9/2010 | Allemand et al. ............ 174/250 |
| 2010/0307792 A1 | 12/2010 | Allemand et al. ......... 174/126.1 |
| 2011/0024159 A1 | 2/2011 | Allemand et al. ......... 174/126.1 |
| 2011/0042126 A1 | 2/2011 | Spaid et al. .................. 174/250 |
| 2011/0045272 A1 | 2/2011 | Allemand .................. 428/292.1 |
| 2011/0048170 A1 | 3/2011 | Bhatia et al. .................... 75/330 |

FOREIGN PATENT DOCUMENTS

| | | |
|---|---|---|
| EP | 1 619 524 | 1/2006 |
| EP | 1 670 065 | 6/2006 |
| JP | 2003-231968 A | 8/2003 |
| JP | 2005-244071 A | 9/2005 |
| JP | 2009-509350 A | 3/2009 |
| JP | 2009-239301 A | 10/2009 |
| WO | 2008/131304 | 10/2008 |
| WO | 2009/120330 | 10/2009 |

* cited by examiner

NANOSTRUCTURE-BASED TRANSPARENT CONDUCTORS HAVING INCREASED HAZE AND DEVICES COMPRISING THE SAME

CROSS REFERENCE TO RELATED APPLICATION

This application claims the benefit under 35 U.S.C. §119(e) of U.S. Provisional Application No. 61/266,945 filed Dec. 4, 2009, whereby this provisional application is incorporated herein by reference in its entirety.

BACKGROUND

Technical Field

This disclosure generally relates to nanostructure-based transparent conductors having increased haze or light-scattering.

Description of the Related Art

Transparent conductors are optically clear and electrically conductive films. They are in widespread use in areas of display, touch-panel, photovoltaic (PV), various types of e-paper, electrostatic shielding, heating or anti-reflective coatings (e.g., windows), etc. Various technologies have produced transparent conductors based on one or more conductive media such as metallic nanostructures, transparent conductive oxides (TCO), conductive polymers, and/or carbon nanotubes.

Depending on the end use, transparent conductors may be created to satisfy certain electrical and optical parameters, including, for example, sheet resistance, optical transparency, and haze. Often, production of transparent conductors requires balancing trade-offs between the electrical and optical performances.

While displays and touch panels generally require that transparent conductors have low haze, high light transmission, and low sheet resistance, there are applications in which high or increased haze is to be combined with low sheet resistance, high light transmission, low reflectivity and low absorption. A predominant application is thin-film PV whereby an increased haze in the transparent electrode assists to increase the coupling of external light into a thin-film PV stack via increased scattering of the incoming light into the semiconducting PV stack. Increased haze or light-scattering is currently achieved through surface-textured TCOs, which are commonly prepared by chemical treatment (e.g., wet-chemical etch) of a pre-deposited TCO (of lower haze) or depositing a high-haze TCO (e.g., a sol gel approach). However, this approach is limited by the nature of the TCOs (e.g., their chemical and physical microstructure) in the types of scattering structure that can be achieved.

Metallic nanostructure-based transparent conductors may display haze/light-scattering due to the presence of the nanostructures (e.g., nanowires). As a general rule for nanostructure-based transparent conductors, lower sheet resistance is typically associated with more conductive nanostructures, which in turn results in lower light transmission and higher haze. Nevertheless, in a typical nanostructure-based transparent conductor at a sheet resistance in the 10 Ohms/square (a typical value for PV applications), the haze (photoptically measured) is in the 5%-8% range. Although this level of light-scattering is typically too high for displays, touch-panel and certain other applications, it may be too low for thin film PV applications. In particular, for silicon-based thin film PV such as a-Si or um-Si or a-Si/um-Si tandem PV cells and modules, a haze value of at least 15% is typically targeted. Thin-film photovoltaic devices that employ other photovoltaic elements such as organic PV, organic-inorganic hybrid PV, copper indium gallium (di)selenide (CIGS) and CdTe may also benefit from relatively high haze transparent conductors.

BRIEF SUMMARY

The present disclosure relates to modifications to nanostructure-based transparent conductors to achieve increased haze/light-scattering with different and tunable degrees of scattering. These modified transparent conductors are suitable for any device that employs transparent electrodes. They are particularly suited as front and/or back electrodes in opto-electrical device that is capable of converting light to electricity (e.g., PV) or electricity to light (e.g., light-emitting diode or organic light-emitting diode). In addition to the macroscopically measured haze value, the microscopic structure of hazy/scattering layer may be important for good device performance, including, e.g., enhancing contact and work function.

Various embodiments described a variety of light-scattering materials or media that can be combined with nanostructure-based transparent conductors in a variety of configurations. The scattering media may be of diverse materials as well as morphologies (including microstructures and nanostructures), thus allowing customization and tuning of the light-scattering to meet the performance parameters of the device incorporating the transparent conductor.

One embodiment provides a transparent conductive layer comprising: a first plurality of conductive nanostructures; and a second plurality of a light-scattering material. In a further embodiment, the transparent conductive layer has a haze value of more than 5% and a sheet resistance of no more than 200 Ohms/square.

Various other embodiments provide transparent conductive layers having a composite of the conductive nanostructures and light-scattering material, wherein the transparent conductive layers have haze values of more than 10%, 15%, 20%, 25%, 30%, 35%, 40%, 45%, 50%, 55%, 60%, 65%, or 70%. In other embodiments, the haze values are in the range of 10-25%, 15-30%, 20-35%, 25-40%, 30-45%, 35-50%, 40-55%, 45-60%, or 50-65%.

A further embodiment provides a fluid dispersion comprising: a first plurality of conductive nanostructures; and a light-scattering material; wherein the conductive nanostructures and the light-scattering material are present at a weight ratio in a range of 50:1 to 1:10.

In various additional embodiments, the weight ratio of the conductive nanostructures and the scattering particles in a fluid dispersion can be in a range of 25:1 to 1:2.5; or in a range of 10:1 to 1:5; or in a range of 25:1 to 5:1; or in a range of 25:1 to 1:1.

In further embodiments, the transparent conductive layer has a sheet resistance of no more than 150 Ohms/square, or no more than 100 Ohms/square, or no more than 80 Ohms/square, or no more than 50 Ohms/square or no more than 20 Ohms/square, or no more than 10 Ohms/square.

In an alternative embodiment, a fluid dispersion comprising: a first plurality of conductive nanostructures; and a precursor material capable of converting into light-scattering particles.

Yet another embodiment provides a layered transparent conductor comprising: a substrate; a conductive layer includes a plurality of conductive nanostructures; and a light-scattering layer adjacent to the conductive layer, the light-scattering layer includes a second plurality of light scattering particles.

In various embodiments, the light-scattering layer can be an overcoat layer overlying the conductive layer, or an intermediate layer between the conductive layer and a substrate, or an adjoining layer of the conductive layer caused by phase-separation.

A further embodiment provides a device comprising: a first electrode; a second electrode, and an active layer disposed between the first electrode and the second electrode, wherein at least one of the first and second electrodes comprises a high-haze transparent conductor as described herein.

In various embodiments, the active layer may be a multi-layer stack, such as a photovoltaic element, or a light-emitting element. In various other embodiments, the device may further comprise a first buffer layer disposed between the first electrode and the active layer; and/or a second buffer layer disposed between the second electrode and the active layer.

DETAILED DESCRIPTION

Nanostructure-based transparent conductors with high haze are described. In particular, various embodiments describe a variety of light-scattering materials or media that can be combined with conductive nanostructure-based transparent conductors in a variety of configurations. The scattering media may be of diverse materials as well as morphologies (including microstructures and nanostructures), thus allowing customization and tuning of the light-scattering to meet the performance parameters of the device incorporating the transparent conductor.

Any application that requires at least partially (preferably relatively highly) transparent coating (e.g., typically >70%, >80%, or >85% in light transmission) with relatively low sheet resistance (e.g., less than 20 Ohms/square, or less than 15 Ohms/square or more typically, less than 10 Ohms/square) and relatively high haze/light scattering (typically >10%, more typically >15%, more typically in the range of 20-50%) may employ the high haze nanostructure-based transparent conductors described herein. Other suitable applications may require high haze and semi-transparency while the sheet resistance could be higher than described above. The scattering media of the disclosure preferably, though not necessarily, also have low absorption themselves. The preferred applications include, without limitation, PV devices, preferably thin-film PV (organic thin-film PV, organic-inorganic hybrid, CIGS, CdTe, Si-based, etc.), and most preferably a-Si or um-Si or a-Si/um-Si tandem stacks.

Figure 1:
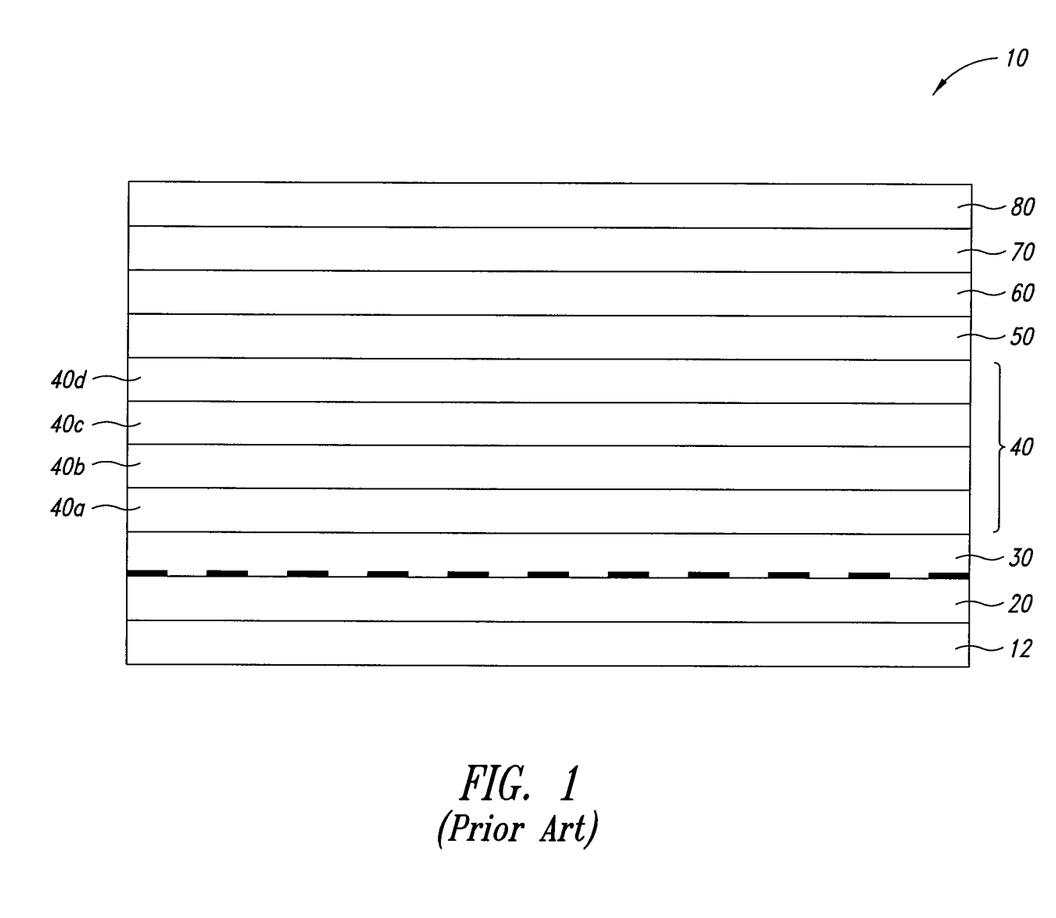
FIG. 1 shows a type of a-Si/um-Si tandem thin film PV cell that employs a TCO layer (textured) as a transparent electrode.

FIG. 1 shows a common arrangement of a-Si/um-Si tandem thin film PV cell 10, which includes: a glass substrate 12, a front electrode 20 made of TCO, an optional buffer layer 30 for ohmic injection (e.g., doped p-type SiC or ZnO), an active layer 40 of photovoltaic elements that include p-type a-Si layer 40a, n-type a-Si layer 40b, p-type μm layer 40c and n-type μm layer 40d, an optional buffer layer 50 ($ZnO_x$), a back electrode and reflector 60 (e.g., Ag), an optional encapsulating/laminating layer 70 (e.g., ethyl vinyl acetate) and a further optional top encapsulating layer 80 (e.g., glass or plastic). The TCO layer 20 is typically surface textured (shown by dashed lines 90) to increase light scattering for the purpose of improving light input coupling in the active layer. Many other alternative configurations are possible. For example, without limitation, an un-doped intrinsic silicon layer may be included between one or more of the n-type silicon layers and p-type silicon layers.

Figure 2A:
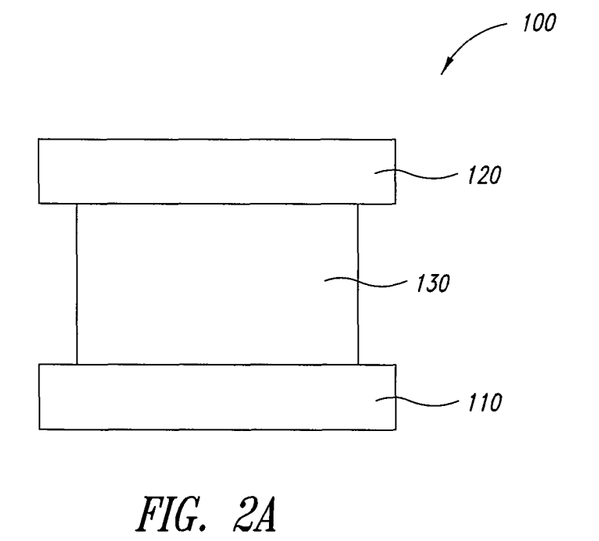
FIGS. 2A and 2B show opto-electrical devices according to various embodiments of the present disclosures.
Figure 2B:
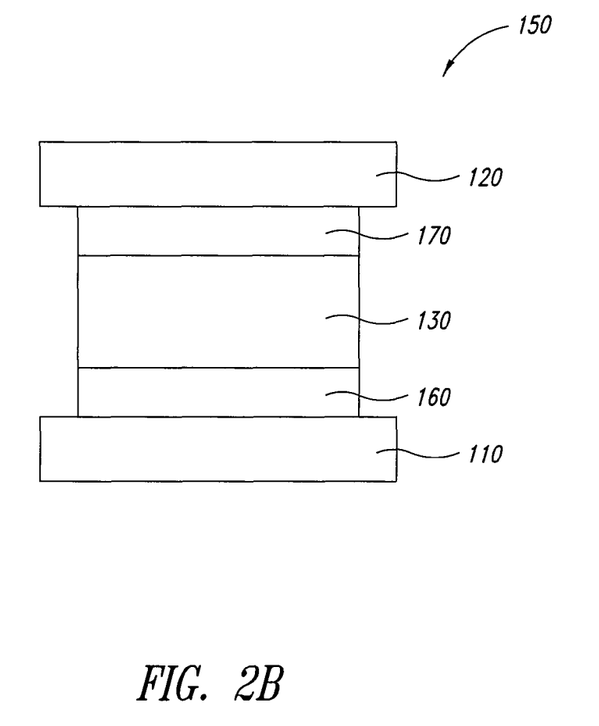

In various embodiments, the nanostructure-based transparent conductor in accordance with the present disclosure serves to replace the surface-textured TCO layer (20 and 90) depicted in FIG. 1. Thus, FIG. 2A shows an embodiment in which a device 100 (e.g., a PV) comprises a first electrode 110; a second electrode 120, and an active layer 130 disposed therebetween, wherein at least one of the first electrode and the second electrode is formed of a high-haze nanostructure-based transparent conductor. FIG. 2B shows a further embodiment in which a device 150 further comprises a first buffer layer 160 disposed between the first electrode 110 and the active layer 130, and a second buffer layer 170 disposed between the second electrode 120 and the active layer 130.

Advantageously, the nanostructure-based transparent conductor achieves high haze through a direct liquid dispersion-based approach.

Thus, one embodiment provides a transparent conductive layer comprising: a first plurality of conductive nanostructures; and a second plurality of a light-scattering material. In various embodiments, the transparent conductive layer has a haze value of more than 5% and a sheet resistance of no more than 200 Ohms/square. Various other embodiments provide transparent conductive layers having a composite of the conductive nanostructures and light-scattering material, wherein the transparent conductive layers have haze values of more than 10%, 15%, 20%, 25%, 30%, 35%, 40%, 45%, 50%, 55%, 60%, 65%, or 70%. In other embodiments, the haze values are in the range of 10-25%, 15-30%, 20-35%, 25-40%, 30-45%, 35-50%, 40-55%, 45-60%, or 50-65%, while the sheet resistances are no more than 150 Ohms/square, or no more than 100 Ohms/square, or no more than 80 Ohms/square, or no more than 50 Ohms/square or no more than 20 Ohms/square, or no more than 10 Ohms/square.

The various components are described in more detail below.

Conductive Nanostructures

Generally speaking, the transparent conductors described herein are thin conductive films of conductive nanostructures. In the transparent conductor, one or more electrically conductive paths are established through continuous physical contacts among the nanostructures. A conductive network of nanostructures is formed when sufficient nanostructures are present to reach an electrical percolation threshold. The electrical percolation threshold is therefore an important value above which long range connectivity can be achieved.

As used herein, "conductive nanostructures" or "nanostructures" generally refer to electrically conductive nano-sized structures, at least one dimension of which is less than 500 nm, more preferably, less than 250 nm, 100 nm, 50 nm or 25 nm.

The nanostructures can be of any shape or geometry. In certain embodiments, the nanostructures are isotropically shaped (i.e., aspect ratio=1). Typical isotropic nanostructures include nanoparticles. In preferred embodiments, the nanostructures are anisotropically shaped (i.e., aspect ratio≠1). As used herein, aspect ratio refers to the ratio between the length and the width (or diameter) of the nanostructure. The anisotropic nanostructure typically has a longitudinal axis along its length. Exemplary anisotropic nanostructures include nanowires and nanotubes, as defined herein.

The nanostructures can be solid or hollow. Solid nanostructures include, for example, nanoparticles and nanowires. "Nanowires" thus refers to solid anisotropic nanostructures. Typically, each nanowire has an aspect ratio (length:diameter) of greater than 10, preferably greater than 50, and more preferably greater than 100. Typically, the nanowires are more than 500 nm, more than 1 µm, or more than 10 µm long.

Hollow nanostructures include, for example, nanotubes. Typically, the nanotube has an aspect ratio (length:diameter) of greater than 10, preferably greater than 50, and more preferably greater than 100. Typically, the nanotubes are more than 500 nm, more than 1 µm, or more than 10 µm in length.

The nanostructures can be formed of any electrically conductive material. Most typically, the conductive material is metallic. The metallic material can be an elemental metal (e.g., transition metals) or a metal compound (e.g., metal oxide). The metallic material can also be a bimetallic material or a metal alloy, which comprises two or more types of metal. Suitable metals include, but are not limited to, silver, gold, copper, nickel, gold-plated silver, platinum and palladium. The conductive material can also be non-metallic, such as carbon or graphite (an allotrope of carbon).

As described herein, although the light-scattering material may also include nanostructures that are conductive, they may have physical attributes that are distinct from the conductive nanostructures that form the conductive pathways or network layer. Typically, these light-scattering nanostructures (conductive or not) have smaller aspect ratios (e.g., shorter and wider nanowires), which contribute to an increased haze value.

Transparent Conductive Film

In general, a transparent conductive film or coating is formed by depositing a liquid dispersion (or ink formulation) comprising a liquid carrier and a plurality of conductive nanostructures, and allowing the liquid carrier to dry.

The transparent conductive film comprises nanostructures that are randomly distributed and interconnect with one another. The nanostructure network layer often takes the form of a thin film that typically has a thickness comparable to that of a diameter of the conductive nanostructure. As the number of the nanostructures reaches the percolation threshold, the thin film is electrically conductive. Other nonvolatile components of the ink composition, including, for example, one or more surfactants and viscosity modifiers, may form part of the conductive film. Thus, unless specified otherwise, as used herein, "conductive film" refers to a nanostructure network layer formed of networking and percolative nanostructures combined with any of the non-volatile components of the ink composition, and may include, for example, one or more of the following: viscosity modifier, surfactant and corrosion inhibitor.

The electrical conductivity of the conductive film is often measured by "sheet resistance," or "resistivity," which is represented by Ohms/square (or "Ω/☐"). The film resistance is a function of at least the surface loading density, the size/shapes of the nanostructures, and the intrinsic electrical property of the nanostructure constituents. As used herein, a thin film is considered conductive if it has a sheet resistance of no higher than $10^8 \Omega/\square$. Preferably, the sheet resistance is no higher than $10^4 \Omega/\square$, 3,000 Ω/☐, 1,000Ω/☐ or 350Ω/☐, or 100Ω/☐. Typically, the sheet resistance of a conductive network formed by metal nanostructures is in the ranges of from 10Ω/☐ to 1000Ω/☐, from 100Ω/☐ to 750 Ω/☐, 50Ω/☐ to 200Ω/☐, from 100Ω/☐ to 500Ω/☐, or from 100Ω/☐ to 250Ω/☐, or 10Ω/☐ to 200Ω/☐, from 10Ω/☐ to 50Ω/☐, or from 1Ω/☐ to 10Ω/☐. For the opto-electrical devices described herein, the sheet resistance is typically less than 20, or less than 15, or less than 10 Ohms/square.

Optically, the nanostructure-based transparent conductors have high light transmission in the visible region (400-700 nm). Typically, the transparent conductor is considered optically clear when the light transmission is more than 70%, or more typically more than 85% in the visible region. More preferably, the light transmission is more than 90%, more than 93%, or more than 95%. As used herein, unless specified otherwise, a conductive film is optically transparent (e.g., more than 70% in transmission). Thus, transparent conductor, transparent conductive film, layer or coating, conductive film, layer or coating, and transparent electrode are used interchangeably.

Haze is an index of optical clarity. It is generally recognized that haze results from light-scattering and reflection/refraction due to both bulk and surface roughness effects. For the opto-electrical devices described herein, high-haze transparent conductors are preferred. These transparent conductors typically have haze values of more than 10%, more typically more than 15%, or more typically, in the range of 20-50%. Unless otherwise specified, the haze value of a give transparent conductor described and claimed herein is measured photoptically in accordance with ASTM D 1003-07, "Standard Test Method for Haze and Luminous Transmittance of Transparent Plastics."

In certain embodiments, a high-haze transparent conductor may refer to a single conductive layer that comprises conductive nanostructures in combination with a scattering material. In other embodiment, a high-haze transparent conductor may refer to a composite film structure that includes said nanostructure network layer and additional layers such as a light-scattering layer (e.g., an overcoat layer that includes a light-scattering material).

Light-Scattering Materials

As used herein, a light-scattering material refers to an inert material that causes light diffusion. The light-scattering material includes, for example, particulate scattering media or scattering-promoting agents (e.g., precursors).

In certain embodiments, the light-scattering material is in the form of particles, also referred to as "light-scattering particles," which can be directly incorporated into a liquid dispersion in combination with conductive nanostructures. The conductive film resulting from such a liquid dispersion thus comprises the light-scattering material intermixed with the interconnecting conductive nanostructures. The light-scattering particles may also be formulated into a liquid dispersion independent of the conductive nanostructure and be formed into a light-scattering layer adjacent to the transparent conductive layer.

The light-scattering particles are preferably micro-sized particles, or more preferably nano-sized particles. Typically, the particle sizes are in the range of 1 nm to several microns; preferably in the range of 10 nm-800 nm, 10 nm-600 nm, 10-400 nm, or 10-200 nm. More typically, the particle sizes are in the range of 1-100 nm.

The light-scattering particles may be in the form of individual, primary particles, or in the form of agglomerates of the primary particles, also referred to as "secondary particles." The agglomeration may be spontaneous in the liquid phase, and/or during coating and drying processes. As an example, light-scattering particles may start with predominantly primary particles and (if present) a small number of secondary particles in a liquid dispersion. During film-making, larger secondary particles may form in the dry conductive film, which scatter light and are capable of improving light input coupling in, for example, a PV stack.

Alternatively, a liquid dispersion may comprise conductive nanostructures and the light-scattering particles already in the larger secondary agglomerated forms, whereby the size and distribution of said secondary scattering particles can be manipulated (preferably reduced) through dispersion processing (e.g., ultra-sonicating, settling, temperature treatments, solvent treatments, addition of additives such as dispersants, surfactants and other surface-active species).

The light-scattering particles may be an inorganic material, which may be conductive, semiconductive, or non-conductive. Examples of suitable light-scattering particles include, without limitation, $SiO_x$, $AlO_x$, $InO_x$, $SnO_x$, $ZnO_x$, Al-doped ZnO (AZO), indium tin oxide (ITO), Sb-doped $SnO_x$ (ATO), $TiO_x$, SiC, fluorine-doped $SnO_x$ (FTO), and the like. Examples of higher refractive index particles include $TiO_x$, $AlO_x$, and $ZnO_x$. Examples of conductive particles include ITO, AZO, ATO, and the like. Different oxidation ratios (stoichiometries and hence doping-levels) may be used, particularly with respect to systems that include three or more elements (e.g., AZO, ATO, ITO). In particular and in preferred embodiments, such materials, compositions and doping levels may be used for the scattering additives and also act as a suitable buffer and interface layer between the conductive nanostructure network and an adjacent semiconductor (e.g., a-Si, um-Si layer in a PV stack). For example, without limitation, AdNano® ZnO 20 and AdNano® Z805 nanoparticles and AdNano® ZnO deionized water (DW)-based dispersion can be used in this way.

Alternatively, the light-scattering particles are the same conductive nanostructures that form the nanostructure network. While these particles are capable of inducing scattering, the level of the scattering is influenced by the morphologies of the nanostructures. For example, use of silver nanowires, especially silver nanowires of relatively large diameter may create relatively high haze films. These "fat nanowires" in the conductive nanostructure layers that are relatively hazy function as the light-scattering particles.

The light-scattering particles may also be polymeric or generally organic nano- or micro-particles (e.g., polystyrene beads).

Structurally, the light-scattering particles may also be of a non-uniform multi-layer or core-shell chemical composition, e.g., particles with cores of one-material (e.g., ATO or other), or coated with a surface/shell layer of another material (e.g., $TiO_x$).

The shapes of the light-scattering particles can be random, spherical, rod-like (acicular), wires, single and/or multi-wall tubes, pyramid-like, cube-like structures, elliptical, etc. They can be (or predominantly be) smooth or sharp and/or with smooth or sharp surface-features.

In certain embodiments, the light-scattering material may be randomly intermixed with the conductive nanostructures.

In other embodiments, the light-scattering material may undergo a phase-change process after being deposited, thus forming a bi-layer structure in which one layer comprises predominately or exclusively the conductive nanostructures, whereas the other layer comprises predominately or exclusively the light scattering material.

In another embodiment, the light-scattering material is formed in situ during the course of film-formation. More specifically, an organic precursor material is typically provided in a liquid dispersion, following coating, curing and drying, the conditions of which may promote the formation of a final film that incorporates micro-droplets type of micro-structures. For example, depositing, processing and drying a solvent-based UV-precursor material in the presence of small amounts of moisture, the formation of a normally continuous film is likely to be disrupted; and instead, a film containing micro-droplets, which are effective scattering centers, may be formed.

In a further embodiment, the light-scattering material is formed in situ in a particulate form during film formation. More specifically, a precursor of the particulate light-scattering material in a liquid dispersion is deposited or coated on a substrate. The precursor is typically a chemical compound that converts or decomposes to the particulate light-scattering material under the conditions of film formation. For example, chemical precursors such as titanium-isopropoxide (TIP) or ZnOAc, combined with the appropriate solvents and processing conditions, decompose to $TiO_x$ and $ZnO_x$ particles, respectively, and form hazy light-scattering layers.

As discussed herein, the light-scattering material may be mixed directly with a conductive nanostructure dispersion into a coating solution. Alternatively, the light-scattering material may be pre-prepared into particle dispersions, colloids, or formulations, which may be further combined with a conductive nanostructure dispersion into a coating solution.

Thus, a further embodiment provides a fluid dispersion comprising: a first plurality of conductive nanostructures; and a light-scattering material; wherein the conductive nanostructures and the light-scattering material are present at a weight ratio in a range of 50:1 to 1:10.

In various additional embodiments, the weight ratio of the conductive nanostructures and the scattering particles in a fluid dispersion can be in a range of 25:1 to 1:2.5; or in a range of 10:1 to 1:5; or in a range of 25:1 to 5:1; or in a range of 25:1 to 1:1.

In addition to the conductive nanostructure and the light-scattering material, the coating solution further comprises a liquid carrier, and optionally a viscosity modifier (e.g., HPMC) and optionally one or more surfactants (e.g., Triton).

The liquid carrier for the dispersion may be water, an alcohol, a ketone or a combination thereof. Exemplary alcohols may include isopropanol (IPA), ethanol, diacetone alcohol (DAA) or a combination of IPA and DAA. Exemplary ketones may include methyl ethyl ketone (MEK) and methyl propyl ketone (MPK).

The surfactants serve to reduce aggregation of the nanostructures and/or the light-scattering material. Representative examples of suitable surfactants include fluorosurfactants such as ZONYL® surfactants, including ZONYL® FSN, ZONYL® FSO, ZONYL® FSA, ZONYL® FSH (DuPont Chemicals, Wilmington, Del.), and NOVEC™ (3M, St. Paul, Minn.). Other exemplary surfactants include non-ionic surfactants based on alkylphenol ethoxylates. Preferred surfactants include, for example, octylphenol ethoxylates such as TRITON™ (x100, x114, x45), and nonylphenol ethoxylates such as TERGITOL™ (Dow Chemical Company, Midland Mich.). Further exemplary non-ionic surfactants include acetylenic-based surfactants such as DYNOL® (604, 607) (Air Products and Chemicals, Inc., Allentown, Pa.) and n-dodecyl β-D-maltoside.

The viscosity modifier serves as a binder that immobilizes the nanostructures on a substrate. Examples of suitable viscosity modifiers include hydroxypropyl methylcellulose (HPMC), methyl cellulose, xanthan gum, polyvinyl alcohol, carboxy methyl cellulose, and hydroxy ethyl cellulose.

In particular embodiments, the weight ratio of the surfactant to the viscosity modifier in the coating solution is preferably in the range of about 80:1 to about 0.01:1; the weight ratio of the viscosity modifier to the conductive nanostructures is preferably in the range of about 5:1 to about 0.000625:1; and the weight ratio of the conductive nanostructures to the surfactant is preferably in the range of about 560:1 to about 5:1. The ratios of components of the coating solution may be modified depending on the substrate and the method of application used. A preferred viscosity range for the coating solution is between about 1 and 100 cP.

Light-Scattering Layer

As an alternative to incorporating the light-scattering material into a conductive nanowire network layer (as described above), any of the light-scattering material (as well as the precursor materials) describe herein may be incorporated into a light-scattering layer that is independent of the conductive nanostructure network layer. Such a light-scattering layer may be combined with a conductive nanowire network layer in a multi-layer configuration.

The light-scattering layer or coating includes predominately a light-scattering material, as defined herein. Although the light-scattering material may include light-scattering particles that are also conductive, the light-scattering layer does not need to (although can) be conductive, and as such, does not require that the light-scattering particles to form conductive pathways. Instead, the light-scattering layer is to be disposed adjacent to (including adjoining) a conventional transparent conductive layer formed of interconnecting/networking conductive nanostructures, e.g., as disclosed in co-pending, co-owned U.S. patent application Ser. No. 11/504,822 (incorporated by reference herein in its entirety).

Figure 3A:
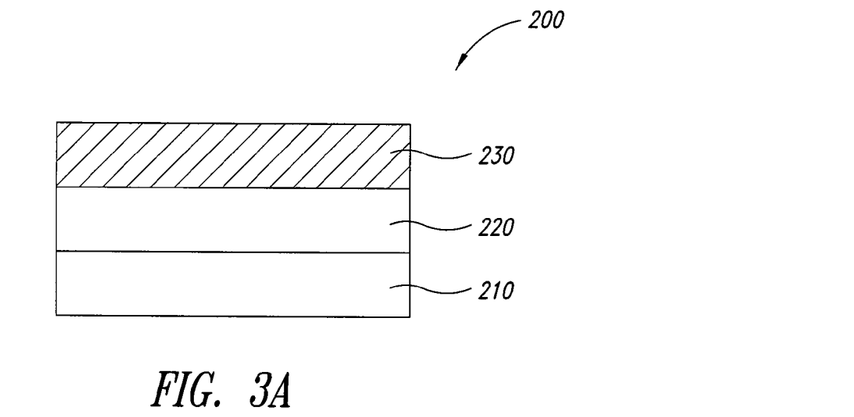
FIGS. 3A, 3B and 3C show various configurations of a multi-layer transparent electrode according to several embodiments of the present disclosures.

FIG. 3A shows a multi-layer configuration 200 comprises a substrate 210, coated with a conductive nanostructure network layer 220, which is further coated with a light-scattering layer 230 (e.g., as an overcoat).

Figure 3B:
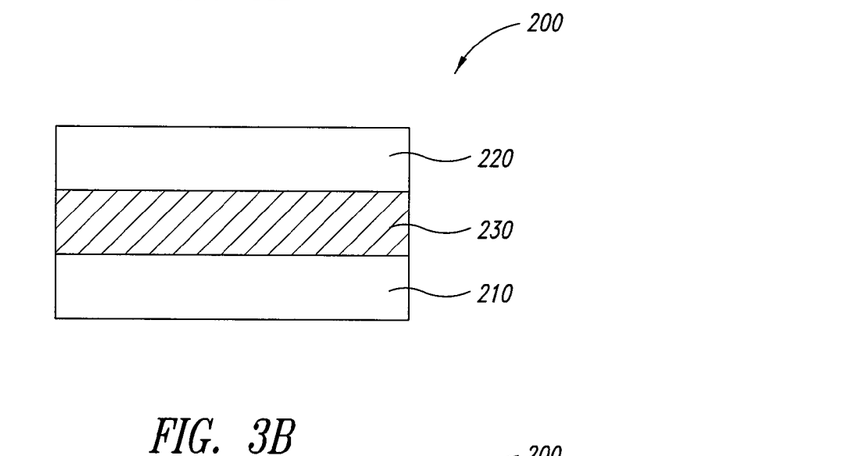

FIG. 3B shows an alternative configuration in which the light-scattering layer 230 is disposed between the substrate 210 and the conductive nanostructure network layer 220.

Figure 3C:
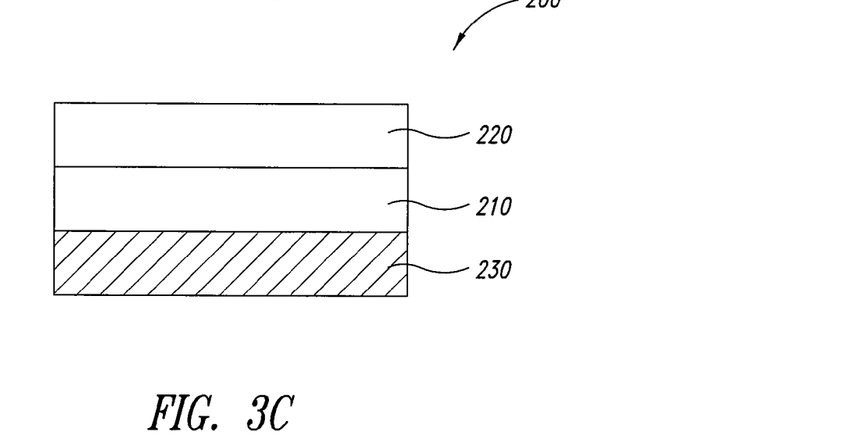

FIG. 3C shows yet another alternative configuration in which the light scattering layer 230 is disposed on an opposite side of the substrate 210 from the conductive nanostructure network layer 220.

Regardless of the configuration, the multi-layer structures are capable of functioning as a transparent electrode with a haze value of more than 10%, or more typically, more than 15%, or more typically, in the range of 20-50%.

As a further alternative to the light-scattering layer acting as an overcoat, a substrate surface, on which a conductive nanostructure layer is coated, can be modified to be hazy itself (e.g., chemically etch-roughened, sand-blasted, or pre-coated with a hazy layer). Alternatively, a substrate may have an embossed hazy coating that has nano-/micro-structures, or has a phase-separated material. The substrate may be a plastic sheet or plastic film or a glass or metal, the detail of which is described in, e.g., U.S. patent application Ser. No. 11/504,822 (supra).

The light-scattering layer may be formed by depositing a liquid dispersion of the light-scattering material, as described herein. Alternatively, the light-scattering layer may be formed by depositing a liquid dispersion of a precursor material, said precursor material forms a light-scattering material in situ during film formation, as discussed above.

In certain embodiments that are analogous to in situ formations of the light-scattering material described above, some materials deposited on a nanostructure-based conductive layer may become hazy even though they might not be so when coated on bare glass. It is believed that, when processed appropriately, a binder material (e.g., HPMC) within the conductive nanostructure dispersion (or coated layer) may induces high haze in a layer deposited on the pre-existing conductive nanostructure or overcoat layer, via, e.g., added particles and a super-imposed secondary surface structure.

The surface morphology of the conductive layer or the overcoat layer(s) in accordance with the present disclosure may have a generally uniform (not in the sense of periodically regular) structure or be of e.g., a bi-modal nature with a primary surface structure accompanied (or covered with) a secondary structure, e.g., one of micron-size dimension and another of much smaller dimensions. This can specifically assist light input coupling into thin-film PV stacks. A preferred embodiment would be a scattering layer that has one structure of lateral and vertical dimensions of the order of a few 100 nm, together with a finer secondary structure.

As another alternative, a relatively hazy conductive nanostructure film (with or without an overcoat) may have a microscopically edgy, rough, sharp structure and such structures could be coated with, soaked in, penetrated with, materials that act to smooth potentially undesirable sharp surface features. This could be, for example, a thin overcoat layer or a sol-gel layer or another nanoparticle dispersion layer; preferably sol-gel layers, or alternatively conductive polymer or also organic conductive layers.

Additive and Other Optional Layers

In general, the approaches above in which one uses scattering particles (primary and/or secondary via agglomerates) may be in separate dispersions or mixed into the conductive nanostructure or overcoat dispersions with the aid of additional additives. These additives may facilitate dispersion stability (e.g., dispersants), help wettability and coating properties (e.g., surfactants, solvent additives, etc.), assist with secondary particle formation or disruption, or help with forming phase-separation structures upon film formation, facilitate drying and/or help to form non-flat (corrugated, etc.) surface features that cause additional increase in haze.

In certain circumstances, steps undertaken to increase haze in the conductive nanostructure layers may compromise the underlying conductive nanostructure network, as judged by an increase in sheet resistance. However, this deterioration may be compensated by gains in optical properties (such as improved haze and transmission). In such cases, in a further embodiment of the disclosure, one may coat a conductive nanostructure layer with a relatively thin additional layer (typically <300 nm, more preferably <200 nm, most preferably around 50-150 nm thick) that acts as an intermediate binder layer to protect the nanostructure network layer (e.g., its sheet resistance) before coating a light-scattering layer.

Alternatively, it is also possible that the incorporation of a light-scattering material may even lower the resulting film sheet resistance, either via a better conductive nanostructure network formation and/or protection of the network from resistance-increasing effects (e.g., high temperature and moisture). In particular, when the scattering particles are also conductive or, as in the case of precursors, forming a conductive matrix, they may create additional conductive nanostructure contacts and fill in the voids between conductive nano structures.

Figure 4:
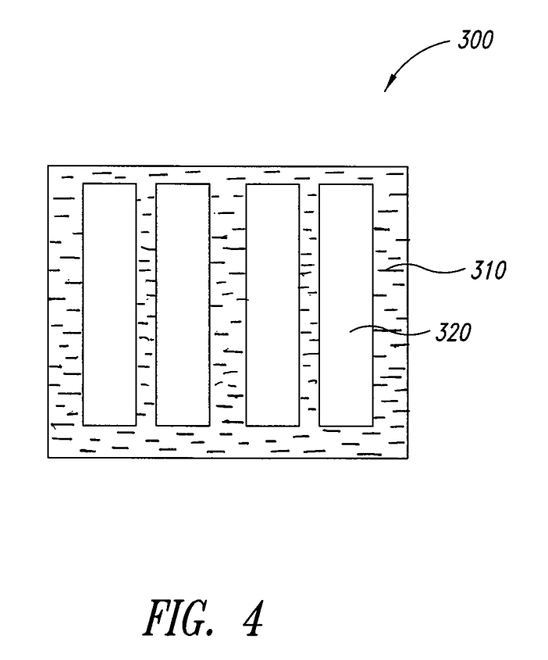
FIG. 4 shows, in accordance with one embodiment, a PV device comprising a substrate sheet with preferentially-aligned, anisotropic conductive nanostructures and PV cell stripes series-interconnected to the adjacent stripes.

In a further embodiment of the disclosure, an increased haze conductive nanostructure layer may be achieved by having a preferential alignment (orientation) of anisotropic conductive nanostructures in the conductive layer. This could be independently achieved by, e.g., coating a conductive nanostructure layer with a light-scattering layer, or causing the anisotropic conductive nanostructures to align (e.g., preferably with high shear-forces, or preferably with fast-evaporating solvents such that a built-in (during deposition) conductive nanostructure orientation does not get randomized). Techniques for achieving such alignment are disclosed, for example, in co-pending U.S. patent application Ser. No. 11/871,721, which is hereby incorporated by reference in its entirety. Such alignment can assist in achieving relatively low sheet resistance in the direction of the alignment with fewer nanowires than those required for a random network, thus helping to increase transmission, and/or reduce reflection and absorption. It also allows or tolerates a higher level of scattering media without costing light transmission. In a specific embodiment (FIG. 4) a thin-film PV module 300 employs a preferentially-aligned nanowire network layer 310 as a transparent electrode, whereby the PC cell series interconnect 320 (i.e. the series-interconnected PC cell stripes of the module) are arranged perpendicular to the preferential nanowire alignment. Note that the nanowires are drawn schematically and are meant to illustrate the direction of the preferential alignment. The nanowires are in fact interconnecting, rather than parallel to each other, in order to form a conductive pathway.

Opto-Electrical Devices

As discussed above, the high haze transparent conductor described herein are particularly suitable as one or both electrodes in an opto-electrical device (e.g., FIGS. 2A, 2B and FIG. 1 in which the TCO is replaced with a transparent conductor of the present disclosure). Many other variations of FIG. 1, FIGS. 2A and 2B may be employed, in which a high-haze transparent conductor in accordance with the present disclosure can be used. For example (with reference to the stack of FIG. 1), a high-haze transparent conductor may be disposed between the buffer layer 50 ($ZnO_x$) and the metallic electrode-reflector 60, though the latter may be completely displaced by the high-haze transparent conductor.

In certain embodiments, a high-haze transparent conductor in accordance with the present disclosure may or may not require a conventional buffer layer (SiC, ZnO) between itself and the adjacent semiconductor PV layer (e.g., the active layer) because the light-scattering material or precursor, under appropriate circumstances (material, doping level, work function), may additionally function as the buffer layer. In other words, a transparent conductor in accordance with the present disclosure may further include media or be composed of media that have a work-function, conductivity, surface micro-structure, surface crystallographic, morphologic structure (or a combination thereof) to reduce or eliminate the need for buffer layers that are conventionally used in PV stacks. In other embodiments, conventional buffer layers can nevertheless be used in combination with the high-haze transparent conductor described herein.

Additional electrode and/or reflector layers may or may not be used with a transparent conductor in accordance with the present disclosure.

A high-haze transparent conductor in accordance with the present disclosure could also be used as the top and/or bottom electrode in CIGS, CdTe, organic PV, organic-inorganic hybrid PV devices.

A high-haze transparent conductor in accordance with the present disclosure can be can be deposited directly on a suitable substrate (glass sheets, plastic sheets, plastic film, possibly also metal sheets or foils, etc.) or be transferred to/laminated to such substrates. As a top electrode, it can be deposited directly onto the PV stack (or an optional buffer layer) or be transferred to, laminated to, etc. such a device. It can be deposited all over or printed-on, transferred-to, laminated-to in a patterned fashion. Where non-patterned or non-printed, it can be post-patterned via, e.g., lithography, and preferably via laser-scribing or laser ablation. Methods of patterning transparent conductive films in accordance with the present disclosure are disclosed in co-pending and co-owned U.S. patent application Ser. No. 11/871,767, which is incorporated herein by reference in its entirety.

In a further embodiment, the transparent conductor in accordance with the present disclosure can incorporate media in addition to the conductive nanostructures, which have controlled, tunable, refractive indices. This approach serves to match the refractive index between the semiconductor stack (e.g., the photovoltaic element) and the adjacent layers to reduce reflection losses. Alternatively and in particular in cases whereby the transparent conductor of the present disclosure acts as the back electrode that reflects unabsorbed light back into the PV stack, said added media could have a refractive index that promotes increased reflection back into the PV stack. In particular, the refractive index of the back electrode could be made different than the refractive index of the adjacent layer in the PV stack by the addition of nanostructures.

A transparent conductor layer in accordance with the present disclosure may facilitate (if the bottom electrode is before the PV semiconductors) improved semiconductor growth and deposition.

EXAMPLES

Example 1

Synthesis of Silver Nanowires

Silver nanowires were synthesized by the reduction of silver nitrate dissolved in ethylene glycol in the presence of poly(vinyl pyrrolidone) (PVP) following the "polyol" method described in, e.g., Y. Sun, B. Gates, B. Mayers, & Y. Xia, "Crystalline silver nanowires by soft solution processing," *Nanoletters* 2(2): 165-168, 2002. A modified polyol method, described in co-pending and co-owned U.S. patent application Ser. No. 11/766,552, produces more uniform silver nanowires at higher yields than does the conventional "polyol" method. This application is incorporated by reference herein in its entirety. Resulting nanowires primarily had lengths from about 13 μm to about 17 μm and diameters from about 34 nm to about 44 nm.

Example 2

Standard Preparation of Ink Composition of Conductive Nanostructures

A typical ink composition for depositing metal nanowires comprises, by weight, from 0.0025% to 0.1% surfactant (e.g., a preferred range is from 0.0025% to 0.05% for ZONYL® FSO-100), from 0.02% to 4% viscosity modifier (e.g., a preferred range is 0.02% to 0.5% for hydroxypropyl methylcellulose (HPMC), from 94.5% to 99.0% solvent and from 0.05% to 1.4% metal nanowires. Representative examples of suitable surfactants include ZONYL® FSN, ZONYL® FSO, ZONYL® FSA, ZONYL® FSH, Triton (x100, x114, x45), TERGITOL®, DYNOL® (604, 607), n-dodecyl β-D-maltoside, and NOVEC®. Examples of suitable viscosity modifiers include hydroxypropyl methyl cellulose (HPMC), methyl cellulose, xanthan gum, polyvinyl alcohol, carboxy methyl cellulose, and hydroxy ethyl cellulose. Examples of suitable solvents include water and isopropanol.

The ink composition can be prepared based on a desired concentration of the nanowires, which is an index of the loading density of the final conductive film formed on the substrate.

The substrate can be any material onto which nanowires are deposited. The substrate can be rigid or flexible. Preferably, the substrate is also optically clear, i.e., light transmission of the material is at least 80% in the visible region (400 nm-700 nm).

Examples of rigid substrates include glass, polycarbonates, acrylics, and the like. In particular, specialty glass such as alkali-free glass (e.g., borosilicate), low alkali glass, and zero-expansion glass-ceramic can be used. The specialty glass is particularly suited for thin panel display systems, including Liquid Crystal Display (LCD).

Examples of flexible substrates include, but are not limited to: polyesters (e.g., polyethylene terephthalate (PET), polyester naphthalate, and polycarbonate), polyolefins (e.g., linear, branched, and cyclic polyolefins), polyvinyls (e.g., polyvinyl chloride, polyvinylidene chloride, polyvinyl acetals, polystyrene, polyacrylates, and the like), cellulose ester bases (e.g., cellulose triacetate, and cellulose acetate), polysulphones such as polyethersulphone, polyimides, silicones, and other conventional polymeric films.

The ink composition can be deposited on the substrate according to, for example, the methods described in co-pending U.S. patent application Ser. No. 11/504,822.

As understood by one skilled in the art, other deposition techniques can be employed, e.g., sedimentation flow metered by a narrow channel, die flow, flow on an incline, slit coating, gravure coating, microgravure coating, bead coating, dip coating, slot die coating, and the like. Printing techniques can also be used to directly print an ink composition onto a substrate with or without a pattern. For example, inkjet, flexoprinting and screen printing can be employed. It is further understood that the viscosity and shear behavior of the fluid as well as the interactions between the nanowires may affect the distribution and interconnectivity of the nanowires deposited.

A sample conductive nanostructure dispersion was prepared that comprised silver nanowires as fabricated in Example 1 dispersed, a surfactant (e.g., Triton), and a viscosity modifier (e.g., low molecular-weight HPMC) and water. The final dispersion included about 0.4% silver and 0.4% HPMC (by weight). This dispersion can be used (neat or diluted) in combination with a light-scattering material (e.g., in a particulate form) directly to form a coating solution. Alternatively, the dispersion can be combined with a dispersion of a light-scattering material to form a coating solution.

Example 3

A coating solution was prepared by vigorously shaking 50% dispersion of ITO nanoparticles (Aldrich, Milwaukee, Wis.) in isopropyl alcohol (IPA) together with 50% silver nanowire dispersion of Example 2. The resulting coating solution was spin-coated onto a 2×2 inch Eagle glass substrate at 1000 rpm for 30 seconds. The coated substrate was then dried at 50° C. for 90 seconds and baked at 180° C. for 90 seconds. During coating and drying this mixture appeared to phase-separate into two layers; an underlying nanowire layer with good/low sheet resistance and an adjacent layer formed from the ITO nanoparticles that provided increased haze. The resulting conductive film had a transmission of 77%, a haze of 67% and a sheet resistance of 25Ω/□.

Example 4

A coating solution was prepared by vigorously shaking 5% dispersion of 30% Ludox® $SiO_x$ nanoparticles in de-ionized water (Aldrich) together with the 95% silver nanowire dispersion of Example 2. The resulting coating solution was spin-coated onto a 2×2 inch Eagle glass substrate at 700 rpm for 30 seconds. The coated substrate was then dried at 50° C. for 90 seconds and baked at 180° C. for 90 seconds. The resulting conductive film had a transmission of about 87%, a haze of about 18% and a sheet resistance of about 20.5Ω/□.

Example 5

A coating solution was prepared by vigorously shaking 10% dispersion of 7.5% Ishihara SN-100D ATO nanoparticles in de-ionized water with 92.5% silver nanowire dispersion of Example 2. The resulting coating solution was spin-coated onto a 2×2 inch Eagle glass substrate at 700 rpm for 30 seconds. The coated substrate was then dried at 50° C. for 90 seconds and baked at 180° C. for 90 seconds. The resulting conductive film had a transmission of about 83%, a haze of about 32% and a sheet resistance of about 16.2Ω/□.

Example 6

A coating solution was prepared by vigorously shaking 10% dispersion of 5% Ishihara TTO-W-5 $TiO_x$ nanoparticles in de-ionized water together with 95% silver nanowire dispersion of Example 2. The resulting coating solution was spin-coated onto a 2×2 inch Eagle glass substrate at 700 rpm for 30 seconds. The coated substrate was then dried at 50° C. for 90 seconds and baked at 180° C. for 90 seconds. The resulting conductive film had a transmission of about 86.3%, a haze of about 48% and a sheet resistance of about 20.5Ω/□. A second conductive film sample was prepared in the same way using 2% Ishihara TTO-W-5 $TiO_x$ nanoparticles in de-ionized water together with 98% silver nanowire dispersion of Example 2. The resulting conductive film had a transmission of about 86%, a haze of about 13.8% and a sheet resistance of about 11.3Ω/□.

Example 7

A 74% Tipaque FS-10D ATO nanoparticle dispersion (from Ishihara) in water with 3% of a 1% solution of Triton X-100 was spin-coated at 700 rpm for 30 seconds on top of two pre-coated nanowire layers. The resulting films were dried at 50° C. for 90 seconds then baked at 180° C. for 90 seconds. The nanowire layers were prepared by spin-coating at 1000 rpm for 30 seconds the nanowire dispersion of Example 2 onto two glass substrates. The resulting films were dried at 50° C. for 90 seconds than baked at 180° C. for 90 seconds. The first of the two multi-layer films was rinsed with de-ionized water and the second was not. The first multi-layer film had a transmission of about 82.5%, a haze of about 10 percent and a sheet resistance of about 12.5Ω/□. The second multi-layer film had a transmission of about 81.5%, a haze of about 66% and a sheet resistance of about 12.4Ω/□.

Example 8

A silver nanowire dispersion was prepared including 0.4% silver nanowires, 0.4% low molecular weight HPMC, 250 ppm Triton and de-ionized water. The silver nanowires used had an average length of 18 microns and an average diameter of 192 nm. The dispersion was spin-coated onto a glass slide at 500 RPM and dried at 50° C. for 90 seconds than baked at 180° C. for 90 seconds. The resulting film had a transmission of 83%, sheet resistance of about 10 Ohms/square and haze of about 19%.

A light-scattering layer comprising a light-scattering material or a precursor thereof can be formed by coating a dispersion of the light-scattering materials on top of a conductive nanostructure film to form a composite conductive film with relatively high haze. Examples of such dispersions include, without limitation, dispersions containing titanium isopropoxide ("TIP") precursor in isopropyl alcohol, dispersions including AdNano LUV (ITO particles) from Evonik, or $TiO_x$ nanoparticles coated with ATO (available from Ishihara), or a precursor material (ZnOAc) in water and HPMC and AZO nanoparticles. In the case of the TIP precursor in IPA, during the spin-coating, this solution in air containing some level of moisture, the moisture in the air converts the TIP precursor into $TiO_x$ nanoparticles. Similarly, the ZnOAc precursor can react with the HPMC to form $ZnO_x$-like nanoparticles that scatter light.

An intermediate binder layer can be disposed between the conductive layer of the nanostructure network and the light-scattering light in order to protect the conductive layer. The intermediate binder layer could, for example and without limitation, include 3% Addison Clear Wave in diacetone alcohol and/or isopropyl alcohol. The intermediate binder layer could also consist of any of the binder materials disclosed in U.S. patent application Ser. No. 11/504,822, incorporated by reference above. Over this binder layer, a third dispersion containing a light-scattering material (e.g., nanostructures) can be coated in order to increase the haze of the final conductive film.

Example 9

Evaluation of Optical and Electrical Properties of Transparent Conductors

The transparent conductive films prepared according to the methods described herein were evaluated to establish their optical and electrical properties.

The light transmission data were obtained according to the methodology in ASTM D1003. Haze was measured using a BYK Gardner Haze-gard Plus. The sheet resistance was measured using a Fluke 175 True RMS Multimeter or contact-less resistance meter, Delcom model 717B conductance monitor. A more typical device is a 4 point probe system for measuring resistance (e.g., by Keithley Instruments).

The haze and transmission of the bare substrate (e.g., 0.04% haze and 93.4% transmission for glass) were typically included in the measurements.

The various embodiments described above can be combined to provide further embodiments. All of the U.S. patents, U.S. patent application publications, U.S. patent application, foreign patents, foreign patent application and non-patent publications referred to in this specification and/or listed in the Application Data Sheet are incorporated herein by reference, in their entirety. Aspects of the embodiments can be modified, if necessary to employ concepts of the various patents, application and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A layered transparent conductor comprising:
   a substrate;
   a conductive layer overlying the substrate, wherein the conductive layer comprises a plurality of conductive nanostructures; and
   a light-scattering layer overlying the conductive layer, wherein the light-scattering layer comprises a plurality of light-scattering primary particles, wherein two or more of the light-scattering primary particles form at least one agglomerated particle, wherein the light-scattering primary particles are not electrically conductive, and wherein the layered transparent conductor has a haze value of more than 10%, a sheet resistance of no more than 200 Ohms/square, and a light transmission of more than 70%.

2. The layered transparent conductor of claim 1, wherein the conductive layer is coated on the substrate.

3. The layered transparent conductor of claim 1, wherein the haze value is more than 15%.

4. The layered transparent conductor of claim 1, wherein the conductive nanostructures are metallic nanowires.

5. The layered transparent conductor of claim 1, wherein the sheet resistance is no more than 20 Ohms/square.

6. The layered transparent conductor of claim 1, wherein the haze value is in a range of 20-50%.

* * * * *